(12) United States Patent
Boulant

(10) Patent No.: US 8,723,519 B2
(45) Date of Patent: May 13, 2014

(54) USE OF STRONGLY MODULATING PULSES IN MRI FOR PROVIDING CHEMICAL SHIFT SELECTIVE FLIP ANGLES

(75) Inventor: Nicolas Boulant, St. Aubin (FR)

(73) Assignee: Commissariat a l'energie Atomique et aux Energies Alternatives, Paris (FR)

( * ) Notice: Subject to any disclaimer, the term of this patent is extended or adjusted under 35 U.S.C. 154(b) by 428 days.

(21) Appl. No.: 13/201,391

(22) PCT Filed: Feb. 18, 2009

(86) PCT No.: PCT/IB2009/005066
§ 371 (c)(1),
(2), (4) Date: Sep. 15, 2011

(87) PCT Pub. No.: WO2010/094995
PCT Pub. Date: Aug. 26, 2010

(65) Prior Publication Data
US 2012/0105060 A1 May 3, 2012

(51) Int. Cl.
*G01V 3/00* (2006.01)
(52) U.S. Cl.
USPC .......................................... 324/309; 324/307
(58) Field of Classification Search
USPC ............................. 324/300–322; 600/409–445
See application file for complete search history.

(56) References Cited

U.S. PATENT DOCUMENTS 5,153,515 A 10/1992 Leigh et al.
6,404,198 B1 * 6/2002 Duerk et al. .................. 324/314

OTHER PUBLICATIONS

International Search Report for Application No. PCT/IB2009/005066 dated Jul. 15, 2009.
Written Opinion for Application No. PCT/IB2009/005066 (undated).
Boulant, N. et al., *Strongly Modulating Pulses for Counteracting RF Inhomogeneity at High Fields*, Magnetic Resonance in Medicine 60:701-708 (2008).
Li, C. et al., *Simultaneous 3D NMR Spectroscopy of Fluorine and Phosphorus in Human Liver During 5-Fluorouracil Chemotherapy*, MRM 35:841-847 (1996).
Fortunato, E. M. et al., *Design of Strongly Modulating Pulses to Implement Precise Effective Hamiltonians for Quantum Information Processing*, Journal of Chemical Physics, vol. 116, No. 17, pp. 7599-7606 (2002).
Kupce, E. et al., *Polychromatic Selective Pulses*, 8305A Journal of Magnetic Resonance Series A 102, 122-126 (1993).

(Continued)

*Primary Examiner* — Brij Shrivastav
(74) *Attorney, Agent, or Firm* — Alston & Bird LLP

(57) ABSTRACT

A method of performing nuclear magnetic resonance imaging of a body comprising at least two populations of nuclei characterized by different spin resonance frequencies, the method comprising the steps of: (a) immerging said body (B) in a static magnetic field ($B_0$) for aligning nuclear spins along a magnetization axis; (b) exposing it to a transverse radio-frequency pulsed field ($B_1$) for flipping said nuclear spins, said radio-frequency pulsed field comprising a train of elementary pulses, each having a constant frequency and amplitude, and a continuous phase; (c) detecting a signal emitted by nuclear spins excited by said radio-frequency pulsed field; characterized in that it also comprises, prior to performing steps (a)-(c), computing a set of optimal parameters (N, $\tau_i$, $\phi_i$, $\omega_i$) of said train of elementary pulses for minimizing the differences between the actual values of the spin-flip angles ($FA^j$) of nuclei belonging to each of said populations and predetermined target values thereof; said predetermined target values being different for nuclei belonging to different populations.

16 Claims, 4 Drawing Sheets

(56) References Cited

OTHER PUBLICATIONS

Larson, P. E. Z. et al., *Multiband Excitation Pulses for Hyperpolarized $^{13}C$ Dynamic Chemical-Shift Imaging*, Journal of Magnetic Resonance 194: 121-127 (2008).

Schricker, A. A. et al., *Dualbank Spectral-Spatial RF Pulses for Prostate MR Spectroscopic Imaging*, Magnetic Resonance in Medicine 46:1079-1087 (2001).

Steffen, M. et al., *Simultaneous Soft Pulses Applied at Nearby Frequencies*, Journal of Magnetic Resonance 146:369-374 (2000).

Haacke, E. M. et al., *Magnetic Resonance Imaging*, Wiley & Sons, New York (1999).

Pravia, M. A. et al., *Robust Control of Quantum Information*, Journal Chemical Physics 119:9993-10001 (2003).

Han, E. et al., *In Vivo T1 and T2 Measurements of Muskuloskeletal Tissue at 3T and 1.5T*, J. Brittain in Proceedings of the 11$^{th}$ Meeting of the ISMRM, p. 450 (2003).

*Magnetic Resonance in Medicine*, 60:701-705(2008).

Li, J. et al., *Control of Inhomogeneous Quantum Ensembles*, Physical Review A, vol. 73, 030302 (2002).

Yarnykh, V. L., *Actual Flip-Angle Imaging in the Pulsed Steady State: A Method for Rapid Three Dimensional Mapping of the Transmitted Radiofrequency Field*, Magnetic Resonance in Medicine, vol. 57, pp. 192-200 (2007).

Schneider, E. et al., *Rapid in Vivo Proton Shimming*, Magnetic Resonance in Medicine, vol. 18, Issue 2, pp. 335-347 (1991).

Amadon, A. et al., *MAFI Sequence: Simultaneous Cartography of B0 and B1*, Proceedings of the 16$^{th}$ Annual Meeting of the ISMRM, Toronto, p. 1248, (2008).

Pike, G. B., *Pulsed Magnetization Transfer Contrast in Gradient Echo Imaging: a Two-Pool Analytic Description of signal Response*, Magn. Reson. Med, 36:95-103, (1996).

Sled, J. G. et al., *Quantitative Imaging of Magnetization Transfer Exchange and Relaxation Properties in Vivo Using MRI*, Magn. Reson. Med, 46:923-931, (2001).

Haacke, E. M. et al., *Fast Imaging in the Steady State*, Magnetic Resonance Imaging, Chapter 18, Wiley & Sons, New York, pp. 451-463 (1999).

Li, J. et al., *Control of Inhomogeneous Quantum Ensembles*, Physical Review A, vol. 73, 030302-1-030302-4 (2002).

\* cited by examiner

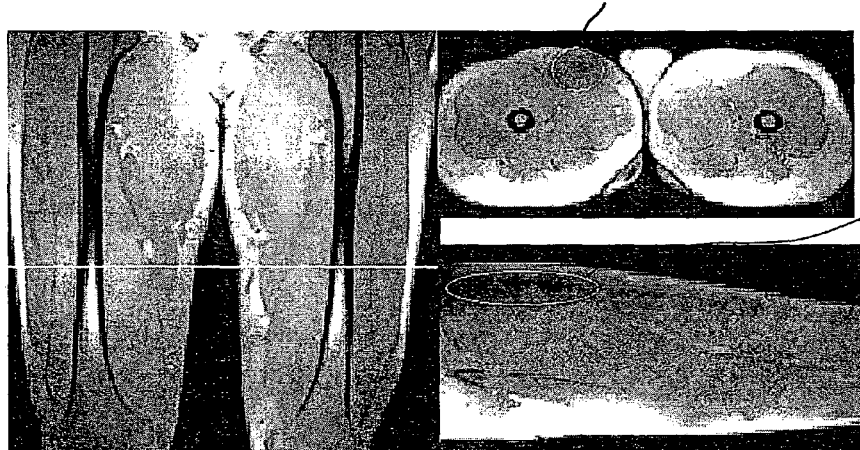
FIG. 5A
FIG. 5B
FIG. 5C
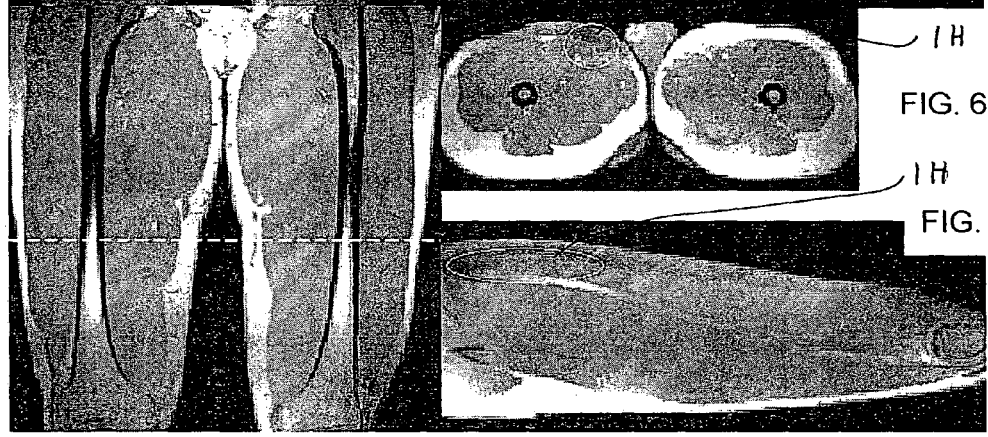
FIG. 6A
FIG. 6B
FIG. 6C
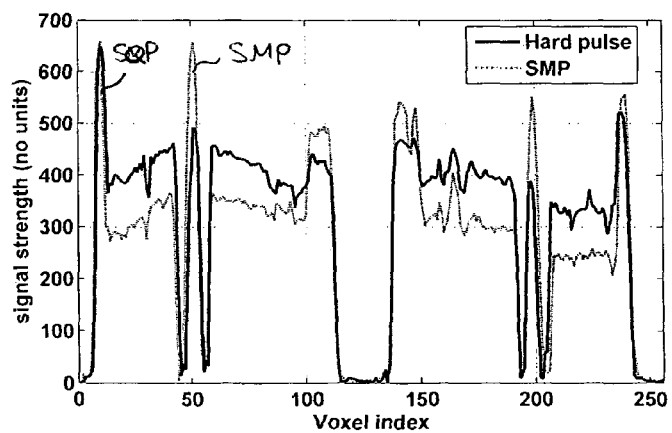
FIG. 7

USE OF STRONGLY MODULATING PULSES IN MRI FOR PROVIDING CHEMICAL SHIFT SELECTIVE FLIP ANGLES

FIELD OF THE INVENTION

The invention relates to a method for improving nuclear magnetic resonance imaging, and to an apparatus for carrying out such a method. The invention applies in particular to nuclear magnetic resonance imaging of a living body, such as a human body.

BACKGROUND

Magnetic resonance imaging (MRI) is a very powerful tool in research and diagnostics. It comprises immerging a body in a static magnetic field $B_0$ for aligning nuclear spins thereof; exposing it to a transverse radio-frequency pulsed field $B_1$ (excitation sequence) at a resonance frequency known as the "Larmor frequency" for flipping said nuclear spins by a predetermined angle; and detecting a signal emitted by flipped nuclear spins, from which an image of the body can be reconstructed.

The book by E. M. Haacke, R. W. Brown, M. R. Thompson and R. Venkatesan "Magnetic Resonance Imaging", Wiley & Sons, New York (1999) describes several conventional MRI techniques; in particular, chapter 18 deals with fast imaging methods, which are widespread e.g. in medical practice.

It is known (see e.g. the above-referenced book by E. M. Haacke, chapter 18, paragraph 1) that the intensity of the MRI signal depends on the spin-flip angle, and reaches a maximum for a spin-flip angle value, known as "Ernst angle" for spoiled gradient echo sequences, which is a function of physical properties of the body to be imaged (relaxation time $T_1$) and of the repetition period of the radio-frequency excitation pulse.

Unfortunately, the Ernst angle is not the same for all the tissues of a body. For example, considering a pulse repetition time of 80 ms, the Ernst angles for protons in muscle and fat tissues are of about 19° and 37° respectively. Therefore, according to the prior art, a same excitation sequence cannot flip the spins of nuclei in different tissues at their respective Ernst angle.

As a consequence, the MRI signal intensity, and therefore the corresponding signal-to-noise ratio, cannot be optimized by conventional excitation sequences for several tissues.

Instead of optimizing the signal intensity, one may want to optimize the contrast between MRI signals radiated by nuclei belonging to different tissues. But even achieving this goal is hindered by the above-discussed phenomenon.

Actually, the Larmor frequency of nuclei of a given chemical specie (typically, Hydrogen) depends on its chemical environment; as a consequence, nuclei (e.g. protons) belonging to different tissues are flipped by slightly different angles by a same excitation sequence, i.e. they respond differently under the influence of an RF pulse. This effect allows independent control of spin flip angles of nuclei belonging to different tissues by using very "soft" pulses whose shapes yield in the Fourier domain the desired excitation around the frequency of interest: see e.g. the paper by M. Steffen, L. Vandersypen and I. Chuang, "Simultaneous soft pulses applied at nearby frequencies", Journal of Magnetic Resonance 146, 369-374 (2000). However, use of such pulses implies long acquisition times and a high specific absorption rate (SAR), which makes this technique unsuitable for in-vivo imaging.

SUMMARY

The present invention aims at eliminating or attenuating the above-mentioned drawbacks of the prior art.

More particularly, the invention aims at providing a method for flipping nuclear spins of nuclei belonging to different media (e.g. tissues) with different flip angles in magnetic resonance imaging. This allows optimizing either the signal-to-noise ratio of the MRI signals or the contrast between MRI signals radiated by nuclei belonging to different tissues.

The invention is based on the use of so-called "strongly modulating pulses", which are trains of elementary pulses, each having a constant frequency and amplitude, and a continuous linear phase. These pulses were originally developed to provide good coherent control for a system of multiple coupled spins for Nuclear Magnetic Resonance Quantum Information Processing. See:

"Design of strongly modulating pulses to implement precise effective Hamiltonians for quantum information processing", E. M. Fortunato, M. A. Pravia, N. Boulant, G. Teklemariam, T. F. Havel and D. G. Cory, Journal of Chemical Physics, vol. 116, pp 7599-7606 (2002); and "Robust control of quantum information", M. A. Pravia, N. Boulant, J. Emerson, A. Farid, E. Fortunato, T. F. Havel, R. Martinez, D. G. Cory, Journal Chemical Physics 119, pp 9993-10001 (2003).

Strongly modulating pulses have also been used in MRI in order to counteract radio-frequency field inhomogeneity, particularly in high-field applications: see the paper by N. Boulant, D. Le Bihan and A. Amadon "Strongly modulating pulses to counteract RF inhomogeneity at high fields", Magnetic Resonance in Medicine, 60:701-705, 2008.

It is interesting to observe that, in the above-cited paper, strongly modulating pulses are used to homogenize the spin-flip angle all over the body to be imaged. On the contrary, in the present invention they are used in order to obtain different spin-flip angles in different body tissues.

According to a different aspect of the invention, strongly modulating pulses can be used for allowing independent control of the nuclear spin-flip angle in different body tissues and, at the same time, counteracting inhomogeneity of either the radio-frequency field, or the stationary magnetic field used for spin orientation, or both. Indeed, the present inventor has discovered that flipping the nuclear spins in different body tissues by the respective Ernst angles does enhance the immunity to field inhomogeneity.

An object of the present invention is a method of performing nuclear magnetic resonance imaging of a body comprising at least two populations of nuclei characterized by different spin resonance frequencies, the method comprising the steps of:

(a) immerging said body in a static magnetic field for aligning nuclear spins along a magnetization axis;

(b) exposing it to a transverse radio-frequency pulsed field for flipping said nuclear spins, said radio-frequency pulsed field comprising a train of elementary pulses, each having a constant frequency and amplitude, and a continuous phase; and (c) detecting a signal emitted by nuclear spins excited by said radio-frequency pulsed field;

also comprising, prior to performing steps (a)-(c), computing a set of optimal parameters of said train of elementary pulses for minimizing the differences between the actual values of the spin-flip angles of nuclei belonging to each of said populations and predetermined target values thereof;

said predetermined target values being different for nuclei belonging to different populations.

Said at least two populations of nuclei can be spatially separated, and usually correspond to different "tissues" of the body to be imaged. The term "tissue" should be understood in a broad sense and is not limited to biological tissues, even if in-vivo MRI of human or animal bodies is a preferred application of the invention.

Preferably, the target values for the spin-flip angles correspond to the Ernst angles for nuclei belonging to said populations.

If counteracting field inhomogeneity is important, a method according to the invention can also comprise a step of determining a statistical distribution of the amplitude of at least one of said radio-frequency pulsed field and the Larmor frequency of nuclei belonging to different populations within a volume of said body. In this case, said step of computing a set of optimal parameters of said train of elementary pulses will comprise computing a set of parameters for jointly minimizing: the errors between the actual values of the spin-flip angles of nuclei belonging to said populations and predetermined target values thereof; said predetermined target values being different for nuclei belonging to different populations; and the statistical dispersions, within the volume of the body, of the spin-flip angles distributions of said populations of nuclei around the respective target values.

Another object of the invention magnetic resonance imaging scanner comprising: a magnet for generating a static magnetic field for aligning nuclear spins of a body to be imaged along a magnetization axis; means for generating a transverse radio-frequency pulsed field, and for directing said radio-frequency pulsed field toward said body in order to flip said nuclear spins; and means for detecting a signal emitted by flipped nuclear spins within said body; wherein said means for generating a radio-frequency pulsed field comprise computing means for carrying out a method as described above.

BRIEF DESCRIPTION OF THE DRAWINGS

Additional features and advantages of the present invention will become apparent from the subsequent description, taken in conjunction with the accompanying drawings, which show:

FIGS. 5A-C, 6A-C and 7, experimental data illustrating the technical result of a method according to a first embodiment of the invention;

DETAILED DESCRIPTION

Figure 1A:
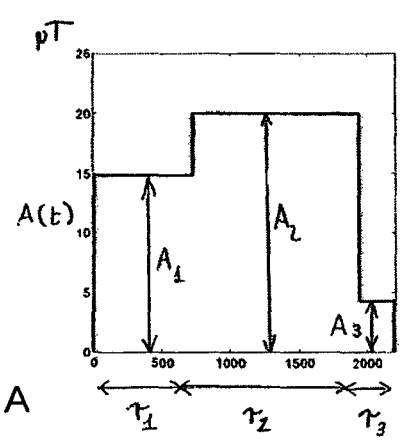
FIGS. 1A and 1B, the time-varying amplitude and phase of a radio-frequency pulsed field to be used in a method according to the invention.
Figure 1B:
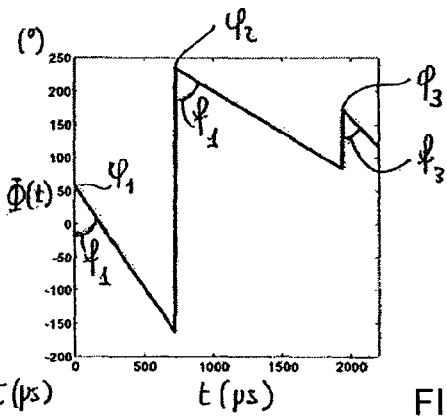

A strongly modulating pulse—or piecewise constant frequency modulated composite radio-frequency pulse—consists of a train of N elementary radio-frequency pulses of duration $\tau_i$, having a constant angular frequency $\omega_i$ and amplitude $A_i$, and a continuous phase $\Phi_i(t) = \omega_i t + \phi_i$, with i=1-N. FIGS. 1A and 1B represent the time-dependent amplitude and phase of a composite radio-frequency pulse composed by N=3 elementary pulses.

Such a pulse is completely defined by a set of 4N parameters ($\tau_i$, $A_i$, $\omega_i$, $\phi_i$) with i=1-N. The method of the invention comprises determining the number N of elementary pulses and the corresponding set of 4N parameters in order to obtain the required control of the spin-flip angle FA for the different populations of nuclei corresponding to different body tissues.

In order to understand how the strongly modulating pulses of FIGS. 1A and 1B can help improving MRI, let us consider the case of the standard 3D spoiled gradient echo (SPGE) MRI sequence, described in the above-referenced book by E. M. Haacke et al., chapter 18, paragraph 1. Other sequences could be analyzed likewise.

In that sequence, the measured steady state signal S(FA) in a voxel located at position r is $$S(FA) = \rho(r)\alpha(r)\frac{1-E1}{1-E1\cos FA}\sin FA e^{-TE/T_2^*}$$

where $\rho$ is the density of the tissue, $\alpha$ is the reception sensitivity of the measuring coil, $E1=\exp(-T_R/T_1)$, FA (also position dependent) is the spin flip angle, TE is the echo time, $T_R$ is the repetition time of the sequence, $T_2^*$ is the transverse decay time of the tissue, and $T_1$ is the relaxation time of the tissue.

The conventional approach consists in trying to make the flip angle FA as spatially uniform as possible, while $\rho$, $T_1$ and $T_2^*$ can be used to provide contrast. Depending on the application, the user or clinician chooses a sequence with corresponding parameters to obtain the contrast that provides the useful information.

For the sake of simplicity, it is expedient to consider only the FA-dependent part of the MRI-signal expression, i.e.

$$S(FA) \propto \frac{1-E1}{1-E1\cos FA}\sin FA$$

It is easy to check that the signal strength is maximum at the Ernst angle $\theta_{Ernst}=a\cos(E1)$. The plot of the signal strength versus the flip angle is provided in FIG. 2. In this figure, the signal strength for fat and muscle are plotted for TR=80 ms, and using $T_1$ values found in the literature ("In vivo T1 and T2 measurements of Muskuloskeletal tissue at 3T and 1.5T", E. Han, G. Gold, J. Stainsby, G. Wright, C. Beaulieu, J. Brittain in Proceedings of the 11th meeting of the ISMRM, p 450, 2003). The Ernst angles are 19° and 37° for the muscle and fat tissues respectively. For some FA, the signals of the two different tissues are very different thereby providing a contrast between them.

Figure 2:
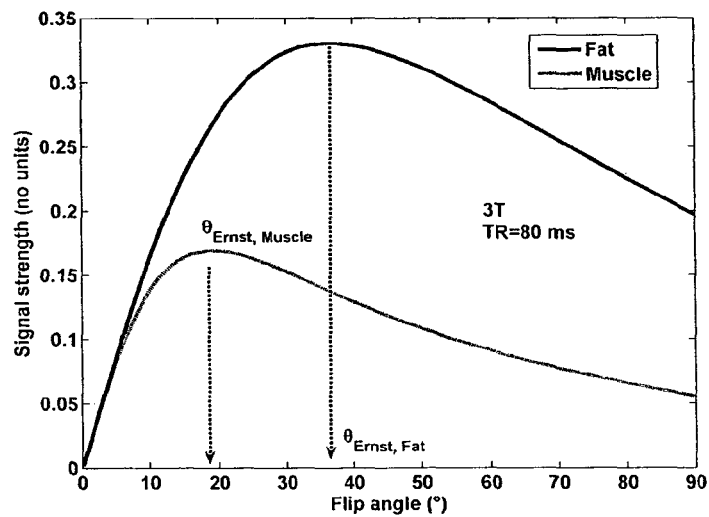
FIG. 2, a theoretical plot of the MRI signal as a function of spin angle for two different body tissues (fat and muscle)

FIG. 2 shows that, from a theoretical point of view, the maximum signal intensity is achieved when the spin of nuclei in both fat and muscle tissue are flipped by their respective Ernst angle. This condition would also lead to a high, albeit not optimal, contrast.

In addition, as the signal strength function reaches a maximum at the Ernst angle, S(FA) is insensitive—to first order—to the inhomogeneity of the radio-frequency pulsed field $B_1$.

Figure 3:
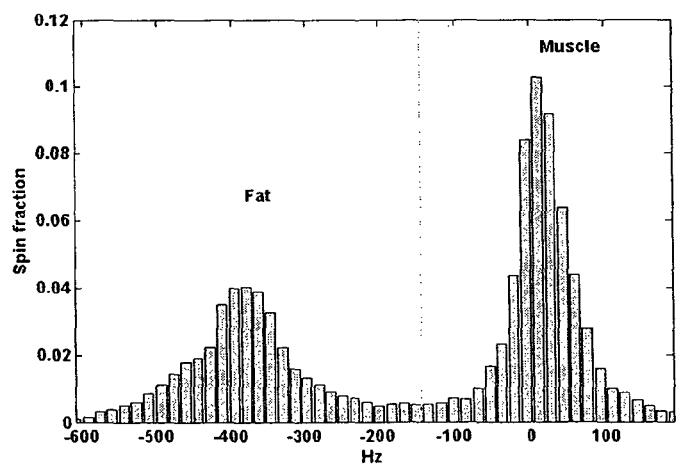
FIG. 3, a histogram of the Larmor frequency distribution in a body comprising two different tissues (fat and muscle) measured at 3 Tesla.

The histogram of FIG. 3 shows the statistical distribution of the Larmor frequency of protons, measured on a volunteer's upper legs in a static magnetic field of 3T.

The histogram shows that the distribution is bimodal, with two peaks corresponding to fat and muscle tissue respectively. These peaks are sufficiently narrow and apart to be discriminated.

In the ideal case of a perfectly uniform $B_0$ field, the peaks would be infinitely narrow, and their separation would only be due to chemical shift. In practice, even if the scanner magnet is designed in order to generate a very uniform magnetic field, magnetic susceptibility of the different tissues of the body induces local fluctuations of the $B_0$ which, in turn, induce fluctuations of the Larmor frequency within each tissue.

For a given RF excitation, the nuclear spin flip angle FA depends on the Larmor frequency. Therefore, the FA statistical distribution is also bimodal, with two peaks corresponding to the two tissues composing the body to be imaged and a peak width which is determined by the $B_0$ and $B_1$ inhomogeneity.

The above-cited paper by N. Boulant et al ("Strongly modulating pulses to counteract RF inhomogeneity at high fields", Magnetic Resonance in Medicine, 60:701-705, 2008) teaches that strongly modulating pulses can be used to counteract the effect on the MRI signal of both $B_0$ (or $f_L$) and $B_1$ inhomogeneity. However, this paper does not consider the bimodal character of the FA distribution.

The present inventor has discovered that strongly modulating pulses can also be used to counteract $B_0$ and/or $B_1$ inhomogeneity in body comprising two or more tissues characterized by different chemical shifts (i.e. different Larmor frequencies).

Moreover, the present inventor has discovered that strongly modulating pulses can also be used for flipping the spins of nuclei belonging to tissues characterized by different chemical shifts (i.e. different Larmor frequencies) by different flip angles, such as the respective Ernst angles.

In conventional NMR, $B_1$ takes the form of a square pulse with a constant frequency, and therefore a linear-varying phase. In these conditions, and at resonance, the flip angle of the spins (FA) is simply proportional to the field amplitude and to the pulse duration. For a time-varying pulse amplitude, but at resonance and without phase discontinuities, the FA is proportional to the integral of $B_1(t)$ with respect to time. If the pulse is slightly off-resonance, as for protons in fat tissue when the pulse is resonant with the Larmor frequency of protons in muscle tissue, FA is modified by an amount which depends on the frequency offset. Therefore, spin-flip angles for nuclei in different tissues cannot be set independently from each other. Moreover, $B_1$ inhomogeneity is directly translated into FA inhomogeneity.

This is no longer true when the phase of the radio frequency pulsed field varies; for a theoretical explanation of this effect, see the paper "Control of inhomogeneous quantum ensembles", by Jr-Shin Li and Navin Khaneja, Physical Review A, vol. 73, 030302 (2002).

The prior-art adiabatic pulse technique and the method of the invention were inspired from this observation. However, the invention is advantageous over the adiabatic technique for at least two reasons:

- strongly modulating pulses require less energy, and less time, than adiabatic pulses;
- within the duration $\tau_i$ of each elementary pulse, the phase of the radio-frequency field varies linearly with time, $\Phi_i(t)=\omega_i t+\phi_i$. Therefore, an analytical solution of the Schrödinger equation for the spins exists, which allows performing calculations in a reasonable time. On the contrary, adiabatic pulses show a nonlinearly-varying phase, and therefore require in general a much longer numerical resolution of the Schrödinger equation.

The Hamiltonian H of a spin ½ at a given position $\vec{r}$ under radio-frequency (RF) irradiation, in a reference frame rotating at the carrier frequency $\omega$, is (h/2π having been set equal to 1 for convenience):

$$H(\vec{r},t) = -\frac{\gamma \Delta B_0(\vec{r})}{2}\sigma_z - \frac{\gamma B_1(\vec{r})}{2}(\sigma_x \cos(\Phi(t)) + \sigma_y \sin(\Phi(t)))$$

where $B_1(\vec{r})$ is the amplitude of the radio-frequency field at point $\vec{r}$, rotating in the same direction as the spins, $\gamma$ is the gyromagnetic ratio (in rad/T), $\sigma_{x,y,z}$ are the Pauli spin matrices, $\Phi(t)$ is the time dependent phase of the RF field and $\Delta B_0(\vec{r})$ is the spatial variation of the static magnetic field $B_0$ perpendicular to $B_1$, with respect to the reference corresponding to the carrier frequency ($B=\omega_{carrier}/\gamma$).

When $\Phi(t)=\phi_0+\omega t$, where $\phi_0$ is the initial phase, t is the time and $\omega$ the angular frequency, in the new frame rotating at $\omega$, the Hamiltonian is time-independent so that the Schrödinger's equation can be integrated to yield the following propagator:

$$U(\vec{r},t) = e^{-i\omega \sigma_z t/2} e^{i((\omega+\gamma \Delta B_0)\sigma_z + \gamma B_1(\sigma_x \cos(\phi_0)+\sigma_y \sin(\phi_0)))t/2}$$

which is a complex matrix of dimension 2 by 2. The spin evolution can therefore be calculated in two steps: the calculation of the propagator U, which then multiplies the initial spin wavefunction; the flip angle calculation follows.

Since a piecewise constant frequency modulated composite radio-frequency pulse consists of a train of N elementary radio-frequency pulses with constant amplitude and linearly-varying phase, the corresponding propagator is simply given by the product of the N propagators of the elementary pulses:

$$U(\vec{r},t) = \prod_{k=1}^{N} e^{-i\omega_k \sigma_z \tau_k/2} e^{i((\omega_k+\gamma \Delta B_0)\sigma_z + \gamma B_{1,k}(\sigma_x \cos(\phi_k)+\sigma_y \sin(\phi_k)))\tau_k/2}$$

where the spatial variation is introduced via $B_1$ and $\Delta B_0$. The dynamics now is rich enough to allow the required control of the FA for the different population of nuclei and yet, its computation can be quickly performed, due to the linear dependence on time of the phase. The optimization algorithm then consists of navigating in this 4N-dimensional parameter space in a given way to find a suitable solution.

Still, computing the propagator $U(\vec{r},t)$ for all the voxels of an image of medical interest would constitute a formidable task. But, this is not necessary. An advantageous feature of the invention is that the spatial distribution of $B_1$ and of the Larmor frequency $f_L$ can be replaced by their statistical distribution. Otherwise stated, the spatial distributions of $B_1$ and $f_L$ are measured, then their values are binned in a two-dimensional histogram. Thus, the propagators and the corresponding spin FA only have to be computed for each bin (a few tens), and not for each voxel (hundreds of thousands, or even millions): this greatly reduces the size of the problem. At the end of the calculation, a spatial map of the FA is not available, but only a statistical distribution (represented by, e.g. a histogram) thereof: however, this distribution contains enough information for allowing optimization of the RF pulses.

Figure 4:
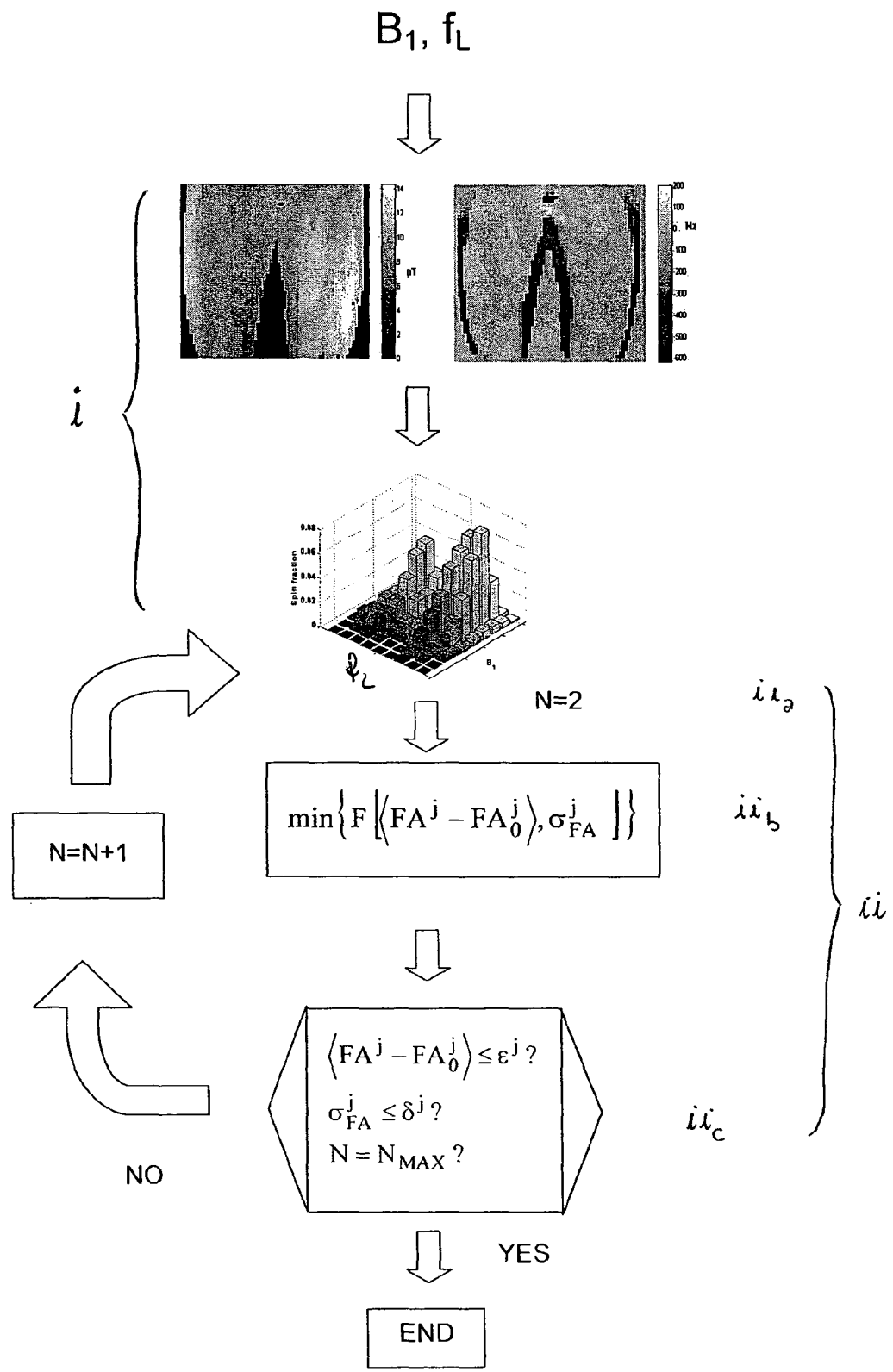
FIG. 4, a flow-chart of a method according to an embodiment of the invention.

The method of the invention will then be described in detail with reference to FIG. 4.

The method usually begins with a preliminary calibration step, which consists in determining the maximum value, with respect to position $\vec{r}$, of the radio-frequency pulsed field amplitude $B_1(\vec{r})$ within the volume of the body to be imaged. This allows normalization of the RF pulse amplitudes in the subsequent steps.

Then (step i) a statistical distribution of the normalized amplitude of the radio-frequency pulsed field within the volume of the body to be imaged is determined. This requires three-dimensional mapping of $B_1$ and $f_L$ (sub-step $i_a$), and binning of the voxels in a bi-dimensional $B_1/f_L$ histogram.

Measurement of the spatial distribution of the radio-frequency field $B_1$ can be performed using the method described in the paper "Actual Flip-Angle Imaging in the Pulsed Steady State: A Method for Rapid Three dimensional Mapping of the Transmitted Radiofrequency field", V. L. Yarnykh, Magnetic Resonance in Medicine, vol. 57, pp 192-200 (2007). This method actually allows measuring the flip angle for a given voxel. However, for a pulse at resonance, the flip angle is merely the integral of the pulse with respect to the time so that the $B_1$ field value can be easily calculated from that measurement. For a spin not at resonance, the error in the calculation mentioned above is small as long as the bandwidth of the RF pulse is large compared to the frequency offset.

As long as FA measurement is performed by irradiating the body by a radio-frequency pulse sequence constituted by: a first pulse adapted for flipping the spins by an angle FA (usually, a square pulse at the Larmor frequency, i.e. at resonance), a first interval $T_{R1}$ during which a first free-induction decay signal is detected in gradient-echo form, a second pulse equal to the first one and a second interval $T_{R2}$ during which a second free-induction decay signal is detected, again in gradient-echo form, the $T_{R1}$ and $T_{R2}$ interval being sufficiently shorter than the longitudinal relaxation time $T_1$ for allowing a first-order analysis. The sequence is repeated several times, in order to reconstruct first and second three-dimensional images from said first and second free-induction decay signals. Then, the ratio between said first and second reconstructed images allows determination of the FA for each voxel.

The measurement of the inhomogeneity of $f_L$ can be performed using the same sequence, but by inserting additional echoes in the first interval ($T_{R1}$) to determine the phase evolution of the spins between the echoes. This technique is described in the following papers:

E. Schneider, G. Glover: "Rapid in vivo proton shimming" Magnetic Resonance in Medicine, volume 18, issue 2, pages 335-347 (1991); and A. Amadon, N. Boulant: "MAFI sequence: simultaneous cartography of B0 and B1", Proceedings of the 16th annual meeting of the ISMRM, Toronto, 2008, p. 1248.

The second step (ii) consists in determining the optimal RF-pulse shape (i.e. the optimal set of parameters N and $\tau_i$, $A_i$, $\omega_i$, $\phi_i$ for i=1-N) in order to minimize jointly:

the errors between the actual values of the spin-flip angles of nuclei belonging to each "nuclear population" (i.e. to each body tissue) and predetermined target values thereof; and the statistical dispersions of the spin-flip angles distributions of said populations of nuclei around the respective target values.

It is important to note that the target values for the spin-flip angles are different for nuclei belonging to different populations or tissues.

In mathematical notation, it is possible to write:

$$\min_{\tau_i, A_i, \omega_i, \varphi_i} \{F[\langle FA^j - FA_0^j \rangle, \sigma_{FA}^j]\}$$

where:
i=1-N, N being the number of elementary pulses;
$FA_0^j$ is the target angle—typically, the Ernst angle—for nuclei belonging to the $j^{th}$ population (tissue);
$\langle FA^j - FA_0^j \rangle$ is the average difference between the actual (calculated) values of spin-flip angles in the $j^{th}$ tissue of the body to be imaged and the respective target value;
$\sigma_{FA}^j$ is the standard deviation of the $FA^j$ distribution; and
F is the cost function to be minimized, which depends on
$\langle FA^j - FA_0^j \rangle$ and $\sigma_{FA}^j$ for all <<j>>, i.e. for all tissues of the body to be imaged.

Indeed, it is not only necessary to homogenize the FA distributions, which are quantified by $\sigma_{FA}^j$, but to homogenize them at the right values, which is expressed by $\langle FA^j - FA_0^j \rangle$.

Moreover, the optimization has to be carried out under a number of constraints, which depend on both the hardware and the body to be imaged (e.g. a human patient, which cannot be exposed to an arbitrarily high RF power): overall duration of the composite pulse ($\Sigma\tau_i$), its peak power, its energy, its maximum frequency, its specific absorption rate, etc. These constraints can be expressed by a penalty function contributing to the "cost function" F to be minimized.

The optimization step (ii) can be carried out iteratively.

First of all ($ii_a$), a minimum number N of elementary pulses is predetermined; usually N=2;

Then ($ii_b$), optimal values for the durations $\tau_i$, amplitudes $A_i$, frequencies $\omega_i$ and relative initial phases $\phi_i$ of said elementary pulses are determined, and the corresponding values of $\langle FA^j - FA_0^j \rangle$ and $\sigma_{FA}^j$ are computed. Optimization consists in minimizing a cost function such as $$F[\langle FA^j - FA_0^j \rangle, \sigma_{FA}^j] = \sum_j [\alpha \langle FA^j - FA_0^j \rangle + \beta \sigma_{FA}^j] + FC$$

where $\alpha$, $\beta$ represent weighting factors and FC the above-mentioned penalty function expressing the constraints on the composite pulses.

In general, the cost function can have several local minima and the optimization procedure can yield a "locally optimal" set of parameters, instead of a "globally optimal" one. However, in most cases such "locally optimal" parameters can be satisfactory, allowing a sufficient homogenization of the flip angle FA.

The errors between the actual spin flip angles and their predetermined target value, $\langle FA^j - FA_0^j \rangle$ and the dispersion of the spin-flip angles distribution $\sigma_{FA}^j$ are then compared to respective threshold values, $\epsilon^j$, $\delta^j$ and/or the cost function FC is compared to a single threshold T (step $ii_c$). If these comparisons show that the optimal composite pulse for the present value of N is not satisfactory and if N has not reached a predetermined maximum value ($N_{max}$), then the value of N is increased by 1 and step ii is iterated. Otherwise, image acquisition can be performed by using the (at least locally) optimal composite pulse.

Taking into account the statistical distributions of both $B_1$ and $f_L$ within the body to be imaged allows maximizing the MRI signal intensity and minimizing the effect of radiofrequency field inhomogeneity. However, especially in the case of imaging at a high static field, this leads to excitation pulses having a comparatively high energy. For example, at $B_0=3T$ and for a repetition time $T_R=80$ ms, the SAR (specific absorption rate) of "optimal" pulses is of about 64% of the safety limits recommended by the International Electrotechnical Commission (IEC), meaning that 51 ms is the minimum time that could be used without exceeding those limits. The repetition time $T_R$ is an important parameter in an MRI sequence that determines the speed at which data is acquired. When a patient is in a scanner, it is important to make the acquisition time minimum to make the exam comfortable, avoid motion artefacts and still obtain high-resolution, good quality, images.

It has been found that designing a strongly modulating pulse based only on the statistical distribution of the Larmor frequency $f_L$ and on the average intensity of the radio-frequency field $B_1$ can drastically reduce the SAR. For example, at 3T the repetition time $T_R$ can be reduced to 21 ms, yet attaining only 11% of the SAR limits. Moreover, signal processing is simplified because there is no need to acquire a $B_1$ map. Of course, signal uniformity is not as good as in the case where the full statistical distribution is used; however, as discussed above, operating at the Ernst angles for all tissues intrinsically reduces the sensitivity of the MRI signal to field inhomogeneity.

A further simplification of the data processing algorithm consists in neglecting both the statistical distributions of $f_L$ and $B_1$. In this case, only the peak values of $f_L$ in the histogram of FIG. 3 are used for computing the shape of the "optimal" strongly modulating pulses. Of course, this further reduces the performances of the method.

FIGS. 5A-5C, 6A-6C and 7 illustrate the technical result of an embodiment of the invention wherein the statistical distributions of both $f_L$ and $B_1$ are used to determine the shape of the excitation pulses.

Images of the upper legs of a healthy volunteer have been acquired with a Siemens Trio 3T scanner, with a whole body coil used for emission, and a surface coil used for reception on the upper legs of two healthy volunteers. The parameters were the following: $B_0=3T$, $T_R=80$ ms.

FIGS. 5A-5C refer to the case where a conventional square excitation pulse was used within a SPGE (Spoiled Gradient Echo) sequence, with a nominal FA=19°, i.e. the Ernst angle for muscle at 3T and for $T_R=80$ ms, while the corresponding Ernst angle for fat tissue is 37°. Ellipses IH encircle region of the images where the MRI signal is particularly weak due to $B_1$-inhomogeneity.

FIGS. 6A-6C refer to the case where a strongly modulating excitation pulse according to the invention was used within the same SPGE sequence, in order to achieve a spin-flip angle of 19° in muscle and of 37° in fat. It is clear that the strongly modulating pulse has been able to mitigate the $B_1$ inhomogeneity to a good extent, with a SAR of 64% of the limit recommended by the IEC. The $B_1$ "holes", visible in FIGS. 5A-5C, have been filled.

FIG. 7 shows a plot of the signal intensity along the continuous line of FIG. 5A (SQP) and the dotted line of FIG. 6A (SMP). As expected, the signal in the fat tissue is higher when using the SMP since maximum signal strength is achieved at the Ernst angle. There is however a 20-25% drop of signal in the muscle when using the strongly modulating pulse because of magnetization transfer (see the papers: Pike G. B. "Pulsed Magnetization Transfer Contrast in Gradient Echo Imaging: a Two-Pool Analytic Description of Signal Response" Magn. Reson. Med 1996; 36: 95-103; and Sled J. G, Pike G. B. "Quantitative imaging of magnetization transfer exchange and relaxation properties in vivo using MRI" Magn. Reson. Med 2001; 46: 923-931). This signal loss could be avoided by reducing the total energy of the radio-frequency excitation pulse, as it can be seen on FIG. 9. However, magnetization transfer also has a beneficial effect: as it does not occur in the fat tissue, it provides additional contrast, hence better distinction between the two different tissues.

Figures 8A, 8B:
FIGS. 8A, 8B and 9, experimental data illustrating the technical result of a method according to a second embodiment of the invention.
Figure 9:
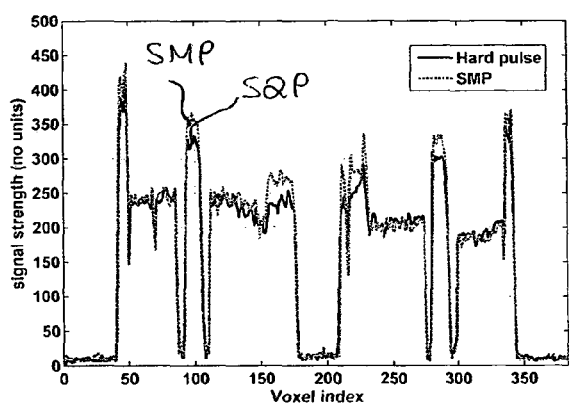
Figure 10:
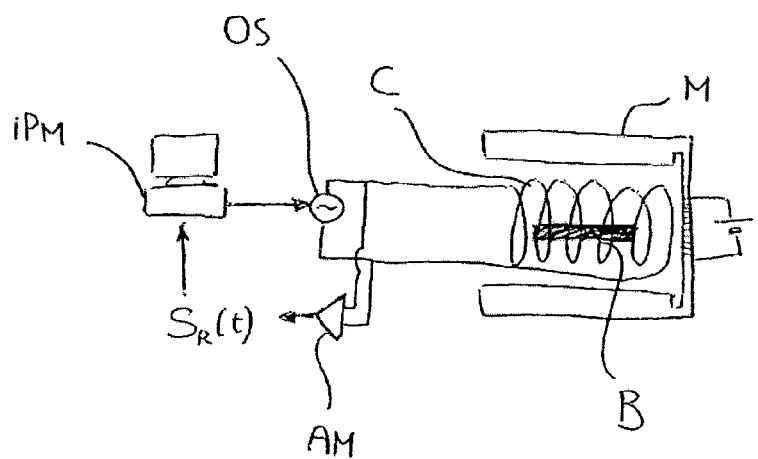
FIG. 10, a magnetic resonance imaging scanner according to a third embodiment of the invention.

FIGS. 8A-8B and 9 illustrate the technical result of a second embodiment of the invention wherein the statistical distribution of $f_L$ and the average value of $B_1$ are used to determine the shape of the excitation pulses. As explained above, the "optimal" waveform obtained this way requires much less energy allowing to implement another SPGE sequence this time with $T_R=21$ ms, 3D matrix of 384×384×104, resolution of 1.1×1.1×2 mm³, in roughly 6 minutes (partial Fourier acquisition of ⅞ in two orthogonal directions, IPAT factor of 2), and yet yielding a SAR of 11% of the recommended limit. With this value of $T_R$, the target, and Ernst, flip angles were 10° and 19° for the muscle and fat tissue respectively. For the SPGE sequence employing a hard (or square) pulse, the nominal flip angle was set to 10° and as mentioned above, was achieved on average. FIGS. 8A and 8B correspond to images obtained, respectively, with strongly modulating pulses and square pulses. FIG. 9 shows the signal intensity along the dotted line on FIG. 8A (SMP) and along the solid line on FIG. 8B (SQP). This time, because the radio-frequency energy of the pulse is much lower, the signal strength is the same in the muscle (no more magnetization transfer effects) while it is larger in the fat. It thus confirms that the pulse implemented a FA closer to the Ernst angle in the fat tissue and that a higher signal-to-noise is obtained. However in this case, the strongly modulating pulse has not compensated for the very low $B_1$ values as efficiently as previously. On the other hand, by pulsing at much lower RF power, it is possible to achieve the highest SNR possible on average—for that sequence and parameter—for both fat and muscle, mitigating to some extent the radio-frequency inhomogeneity, and yet acquire high resolution data in a reasonable time. Mathematically, having a higher signal in the fat tissue everywhere implies that the relative uniformity of the signal is also higher.

A particularly advantageous feature of the method of the invention is that it can be carried out by a conventional scanner provided with suitable information processing means. Such a conventional scanner is schematically represented on FIG. 5. It comprises: a magnet M for generating a static magnetic field $B_0$ in which is immersed a body B to be imaged; a coil C for irradiating said body by a transverse radio-frequency pulsed field $B_1$ and for detecting signal emitted by flipped nuclear spins within said body; electronic means (an oscillator) OS for generating the radio-frequency pulsed field and an amplifier AM for amplifying said spin resonance signal before digitizing it, and information processing means IPM. The information processing means IPM receive and process the amplified resonance signal $S_R(t)$ and, most importantly, controls the oscillator OS, determining the shape, energy, phase and frequency of the RF-pulse. A scanner according to the present invention is characterized in that said information processing means IPM are adapted for carrying out a method as described above. Since the information processing means IPM are usually based on a programmable computer, software means can turn a standard scanner into a device according to the invention, without any need for hardware modifications.

The invention claimed is:
1. A method of performing nuclear magnetic resonance imaging of a body comprising at least two populations of nuclei characterized by different spin resonance frequencies, the method comprising the steps of:
- (a) immerging said body (B) in a static magnetic field ($B_0$) for aligning nuclear spins along a magnetization axis;
- (b) exposing it to a transverse radio-frequency pulsed field ($B_1$) for flipping said nuclear spins, said radio-frequency pulsed field comprising a train of elementary pulses, each having a constant frequency and amplitude, and a continuous linear phase; and
- (c) detecting a signal emitted by nuclear spins excited by said radio-frequency pulsed field;

wherein said also comprises, prior to performing steps (a)-(c), computing a set of optimal parameters (N, $\tau_i$, $\phi_i$, $\omega_i$) of said train of elementary pulses for minimizing the differences between the actual values of the spin-flip angles ($FA^j$) of nuclei belonging to each of said populations and predetermined target values thereof; said predetermined target values being different for nuclei belonging to different populations.

2. A method according to claim 1, wherein said at least two populations of nuclei are spatially separated and correspond to different tissues of the body.

3. A method according to claim 1, comprising exposing said body to a gradient echo pulse sequence, said transverse radio-frequency pulsed field being an element of said sequence, and wherein the target values for the spin-flip angles correspond to the Ernst angles for nuclei belonging to said populations.

4. A method according to claim 1, wherein said set of optimal parameters comprises: the number N of said elementary pulses, as well as the duration ($\tau_i$, $\phi_i$, $\omega_i$), amplitude ($A_1$, $A_2$, $A_3$), frequency ($\omega_1$, $\omega_2$, $\omega_3$) and relative initial phase ($\phi_1$, $\phi_2$, $\phi_3$) of each of them.

5. A method according to claim 4, wherein said step of computing a set of optimal parameters of said composite radio-frequency pulsed field comprises the following substeps:
- predetermining a minimal number (N) of elementary pulses;
- computing optimal values for the durations ($\tau_i$, $\phi_i$, $\omega_i$), amplitudes ($A_1$, $A_2$, $A_3$), frequencies ($\omega_1$, $\omega_2$, $\omega_3$) and relative initial phases ($\phi_1$, $\phi_2$, $\phi_3$) of said elementary pulses, and evaluating the corresponding errors between the actual spin flip angles for each population of nuclei and their respective target value;
- and wherein if the error between the actual spin-flip angle and the corresponding target values ($e^j$, $\delta^j$) exceeds a predetermined threshold for at least one population, and if the number of elementary pulses is less than a predetermined maximum ($N_{MAX}$), increasing said number of elementary pulses and iterating the computation.

6. A method according to claim 1, further comprising a step of determining a statistical distribution of the amplitude of at least one of said radio-frequency pulsed field and the Larmor frequency of nuclei within a volume of said body; wherein said step of computing a set of optimal parameters of said train of elementary pulses comprises computing a set of parameters for jointly minimizing:
- the errors between the actual values of the spin-flip angles of nuclei belonging to said populations and predetermined target values thereof; said predetermined target values being different for nuclei belonging to different populations; and
- the statistical dispersions, within the volume of the body, of the spin-flip angles distributions of said populations of nuclei around the respective target values.

7. A method according to claim 6, wherein said step of determining a statistical distribution of at least one of said radio-frequency pulsed field and the Larmor frequency of nuclei within a volume of said body comprises constructing a histogram of the values taken by the amplitude of said field or fields within said volume of the body.

8. A method according to claim 6, comprising determining a statistical distribution of the amplitude of said radio-frequency pulsed field alone; wherein said step of computing a set of optimal parameters of said composite radio-frequency pulsed field is performed on the basis of said statistical distribution of the amplitude of said radio-frequency pulsed field and on average values of the Larmor frequencies of nuclei belonging to different populations.

9. A method according to claim 6, comprising determining a statistical distribution of the Larmor frequency of nuclei alone; wherein said step of computing a set of optimal parameters of said composite radio-frequency pulsed field is performed on the basis of said statistical distribution of the amplitude of the Larmor frequency of nuclei and on an average value of the amplitude of said radio-frequency pulsed field.

10. A method according to claim 6, comprising determining a statistical distribution of the amplitudes of both said radio-frequency pulsed field and the Larmor frequency of nuclei; wherein said step of computing a set of optimal parameters of said composite radio-frequency pulsed field is performed on the basis of both said statistical distributions.

11. A method according to claim 1, wherein said step of computing a set of optimal parameters of said composite radio-frequency pulsed field is performed by taking into account a penalty function depending on at least one of: the duration of the composite radio-frequency pulsed field, its peak power, its energy, its maximum frequency and its specific absorption rate.

12. A method according to claim 1, wherein said step of computing a set of optimal parameters of said composite radio-frequency pulsed field is implemented by using a genetic algorithm combined with a direct search method.

13. A magnetic resonance imaging scanner comprising:
- a magnet (M) for generating a static magnetic field for aligning nuclear spins of a body (B) to be imaged along a magnetization axis;
- means (C, IPM, OS) for generating a transverse radio-frequency pulsed field, and for directing said radio-frequency pulsed field toward said body (B) in order to flip said nuclear spins; and
- means (C, AM) for detecting a signal emitted by flipped nuclear spins within said body;

wherein said means for generating a radio-frequency pulsed field comprise computing means (IPM) for carrying out a method according to claim 1.

14. A method according to claim 7, comprising determining a statistical distribution of the amplitude of said radio-frequency pulsed field alone; wherein said step of computing a set of optimal parameters of said composite radio-frequency pulsed field is performed on the basis of said statistical distribution of the amplitude of said radio-frequency pulsed field and on average values of the Larmor frequencies of nuclei belonging to different populations.

15. A method according to claim 7, comprising determining a statistical distribution of the Larmor frequency of nuclei alone; wherein said step of computing a set of optimal parameters of said composite radio-frequency pulsed field is performed on the basis of said statistical distribution of the amplitude of the Larmor frequency of nuclei and on an average value of the amplitude of said radio-frequency pulsed field.

16. A method according to claim 7, comprising determining a statistical distribution of the amplitudes of both said radio-frequency pulsed field and the Larmor frequency of nuclei; wherein said step of computing a set of optimal parameters of said composite radio-frequency pulsed field is performed on the basis of both said statistical distributions.

\* \* \* \* \*